(12) United States Patent
Muroor

(10) Patent No.: US 6,734,742 B2
(45) Date of Patent: May 11, 2004

(54) VOLTAGE CONTROLLED OSCILLATOR CAPABLE OF LINEAR OPERATION AT VERY LOW FREQUENCIES

(75) Inventor: Srikanth R. Muroor, Walnut Creek, CA (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 10/060,739

(22) Filed: Jan. 30, 2002

(65) Prior Publication Data

US 2003/0145152 A1 Jul. 31, 2003

(51) Int. Cl.[7] ................................................. H03L 7/00
(52) U.S. Cl. ................. 331/36 C; 331/111; 331/177 R; 327/156
(58) Field of Search ............................... 331/36 C, 111, 331/143, 34, 177 R; 327/156, 157, 158, 159

(56) References Cited

U.S. PATENT DOCUMENTS

| | | | |
|---|---|---|---|
| 5,416,437 A | * | 5/1995 | Contreras et al. ............ 327/536 |
| 5,881,014 A | * | 3/1999 | Ooishi ........................ 365/226 |
| 6,054,887 A | * | 4/2000 | Horie et al. ................ 327/307 |

OTHER PUBLICATIONS

Gregorian, R., et al.; "Analog Mos Integrated Circuits for Signal Processing"; Wiley–Interscience Publication; pp. 448–451.

* cited by examiner

Primary Examiner—Henry Choe
(74) Attorney, Agent, or Firm—Lisa K. Jorgenson; William A. Munck

(57) ABSTRACT

There is disclosed a voltage controlled oscillator (VCO) that receives +V(IN) and −V(IN) control voltages and outputs a VCO output signal having an oscillation frequency determined by the +V(IN) and −V(IN) control voltages. The VCO comprises: 1) a storage capacitor charged linearly by a constant charge current and discharged linearly by a constant discharge current; 2) a comparator for comparing the storage capacitor voltage to an upper threshold voltage and a lower threshold voltage. The comparator output drops to a negative saturation voltage (−V(SAT)) when the storage capacitor voltage rises above the upper threshold voltage and rises to a positive saturation voltage (+V(SAT)) when the storage capacitor voltage drops below the lower threshold voltage. The VCO also comprises: 3) a constant charge current source for injecting the constant charge current into the storage capacitor when the comparator output rises to the positive saturation voltage; and 4) a constant discharge current source for draining the constant discharge current from the storage capacitor when the comparator output drops to the negative saturation voltage.

24 Claims, 5 Drawing Sheets

VOLTAGE CONTROLLED OSCILLATOR CAPABLE OF LINEAR OPERATION AT VERY LOW FREQUENCIES

TECHNICAL FIELD OF THE INVENTION

The present invention is directed generally to data processors, radio transceivers, and other circuits requiring a stable clock reference and, more specifically, to a voltage controlled oscillator (VCO) capable of linear operation at very low frequencies.

BACKGROUND OF THE INVENTION

A voltage controlled oscillator (VCO) is a common circuit used to generate, among other things, clock signals for use in data processors, radio transceivers, and similar circuits. Typically, the VCO is part of a phase-locked loop (PLL) that uses feedback to provide an accurate and stable clock reference signal for other circuits. The frequency of oscillations generated by a VCO are controlled by an externally applied control voltage. Two important parameters in VCO design are linearity and sweep range. Linearity correlates the change in frequency or the VCO output to the change in the control voltage. The sweep range is the range of possible frequencies produced by VCO control voltage. A problem for many voltage controlled oscillators is that there is a trade-off between the sweep range and linearity at low frequency. For any appreciably large sweep range, a conventional VCO typically exhibits non-linearity at low frequency.

Therefore, there is a need in the art for an improved voltage controlled oscillator that has improved linearity at low frequency.

More particularly, there is a need in the art for a voltage controlled oscillator that has a large sweep range while maintaining high linearity at low frequency.

SUMMARY OF THE INVENTION

To address the above-discussed deficiencies of the prior art, it is a primary object of the present invention to provide a voltage controlled oscillator (VCO) capable of receiving a +V(IN) control voltage and a −V(IN) control voltage and outputting a VCO output signal having a frequency of oscillation determined by the +V(IN) control voltage and the −V(IN) control voltage. According to an advantageous embodiment of the present invention, the VCO comprising: 1) a storage capacitor capable of being charged linearly by a constant charge current and discharged linearly by a constant discharge current; 2) a comparator capable of comparing a voltage on the storage capacitor to an upper threshold voltage and a lower threshold voltage, wherein an output of the comparator drops to a negative saturation voltage (−V(SAT)) when the storage capacitor voltage rises above the upper threshold voltage and the comparator output rises to a positive saturation voltage (+V(SAT)) when the storage capacitor voltage drops below the lower threshold voltage; 3) a constant charge current source capable of injecting the constant charge current to the storage capacitor when the comparator output rises to the positive saturation voltage; and 4) a constant discharge current source capable of draining the constant discharge current from the storage capacitor when the comparator output drops to the negative saturation voltage.

According to one embodiment of the present invention, the comparator output is coupled to the VCO output.

According to another embodiment of the present invention, the constant charge current is determined by the +V(IN) control voltage.

According to still another embodiment of the present invention, the constant discharge current is determined by the −V(IN) control voltage.

According to yet another embodiment of the present invention, the constant charge current source comprises a PNP-type bipolar junction transistor having a base coupled to the +V(IN) control voltage, an emitter coupled to the comparator output via a load resistor, and a collector coupled to the storage capacitor.

According to a further embodiment of the present invention, the constant charge current source comprises a NPN-type bipolar junction transistor having a base coupled to the −V(IN) control voltage, an emitter coupled to the comparator output via the load resistor, and a collector coupled to the storage capacitor.

According to a still further embodiment of the present invention, the comparator comprises: 1) an operational amplifier having an inverting input coupled to the storage capacitor; 2) a first resistor (R1) having a first terminal coupled to ground and a second terminal coupled to a non-inverting input of the operational amplifier; and 3) a second resistor (R2) having a first terminal coupled to an output of the operational amplifier and a second terminal coupled to the non-inverting input of the operational amplifier, wherein the operational amplifier output comprises the comparator output.

According to a yet further embodiment of the present invention, the upper threshold voltage is determined by the product: [(R1)/(R1+R2)][+V(SAT)].

In one embodiment of the present invention, the lower threshold voltage is determined by the product: [(R1)/(R1+R2)][−V(SAT)].

In another embodiment of the present invention, the constant charge current is determined by a difference between the positive saturation voltage and the +V(IN) control voltage and constant discharge current is determined by a difference between the negative saturation voltage and the −V(IN) control voltage.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged data processor, radio transceiver, or other circuit requiring a voltage controlled oscillator that operates linearly at low frequency.

Figure 1:
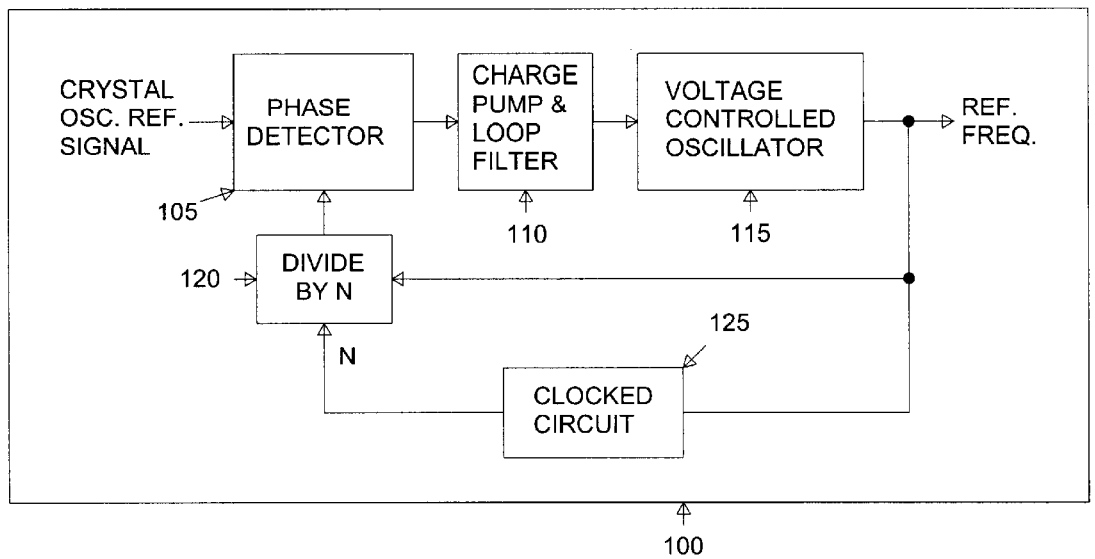
FIG. 1 illustrates an exemplary processing system in which a clocked circuit receives a clock signal from a phase locked loop (PLL) containing a voltage controlled oscillator in accordance with the principles of the present invention.

FIG. 1 illustrates exemplary processing system 100 in which clocked circuit 125 receives a clock signal from a phase locked loop (PLL) containing voltage controlled oscillator 115 in accordance with the principles of the present invention. Processing system 100 comprises phase detector 105, charge pump and loop filter block 110, voltage controlled oscillator (VCO) 115, divider circuit 120, and clocked circuit 125. The PLL comprises phase detector 105, charge pump and loop filter block 110, VCO 115, and divider circuit 120.

Clocked circuit 125 is intended to represent generically any type of circuit component that required a known stable clock reference signal. Thus, clocked circuit 125 may comprise a data processor, a signal processor, a radio transceiver, an ASIC device, or the like.

Phase detector 105 detects the phase difference between the output of divider circuit 120 and a crystal oscillator reference signal and generates a sequence of pulses in which the pulse-width varies according to the magnitude of the phase difference. For example, the crystal oscillator reference signal may be a 1 MHz signal and the divider circuit 120 may divide the 8 MHz reference frequency (REF. FREQ.) produced by VCO 115 by a value of N=8 to produce a 1 MHz output. If the two 1 MHz signals are exactly in phase, the pulses produced by phase detector 105 have a pre-determined width. The pulses are converted to a smooth DC VCO control voltage by charge pump and loop filter block 110. According to an exemplary embodiment of the present invention, the VCO control voltage may be a differential voltage signal. The VCO control voltage controls the frequency of the output of VCO 115, which is applied as a clock signal to clocked circuit 125.

If the 1 MHz frequency of the output of divider circuit 120 begins to lag the 1 MHz crystal oscillator (i.e., actual reference carrier frequency is too low), the pulses produced by phase detector 105 increase in width. The wider pulses are converted to a larger VCO control voltage by charge pump and loop filter block 110. The larger VCO control voltage increases the frequency of the output of VCO 115, which increases the frequency of the output of divider circuit 120. Similarly, if the 1 MHz frequency of the output of divider circuit 120 begins to lead the 1 MHz crystal oscillator (i.e., actual reference carrier frequency is too high), the pulses produced by phase detector 105 decrease in width. The narrower pulses are converted to a smaller VCO control voltage by charge pump and loop filter block 110. The smaller VCO control voltage decreases the frequency of the output of. VCO 115, which decreases the frequency of the output of divider circuit 120.

The value of the divider, N, used by divider circuit 120 may be set by clocked circuit 125 or by some external controller (not shown). In some instances, it may be necessary or desirable to operate clocked circuit 125 at an extremely low frequency or to at least supply a very low-frequency clock signal (along with one or more high-frequency clock signals) to clocked circuit 125. To meet this requirement, the present invention provides a voltage controlled oscillator that is capable of linear operation at very low frequency. The highest oscillation frequency possible depends only on the parasitic capacitances of the components used. As a result, a VCO according to the principles of the present invention is useful in applications in which high linearity and a large sweep range are desired.

Figure 2:
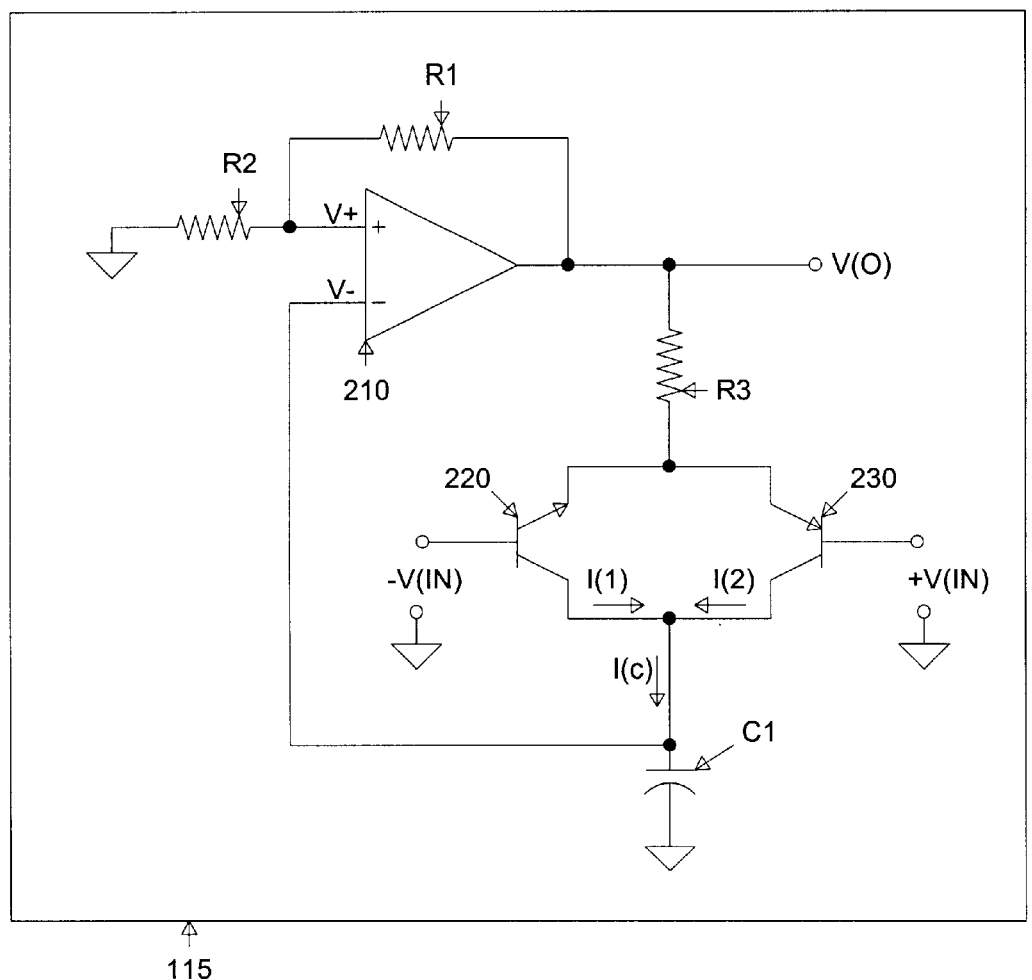
FIG. 2 illustrates an exemplary voltage controlled oscillator in greater detail according to a first embodiment of the present invention.

FIG. 2 illustrates voltage controlled oscillator 115 in greater detail according to a first embodiment of the present invention. Voltage controlled oscillator 115 comprises operational amplifier 210, NPN-type bipolar junction transistor 220, PNP-type bipolar junction transistor 230, capacitor C1, and resistors R1, R2, and R3. VCO 115 receives a differential voltage control signal, [+V(IN), −V(IN)], from charge pump and loop filter block 110 and generates the output voltage V(O). Operational amplifier 210 operates as a comparator and transistors 220 and 230 operate as voltage controlled current sources charging capacitor C1.

The voltage across capacitor C1 depends on the state of the comparator and the control voltage [+V(IN), −V(IN)] applied at the transistor base terminals. When the comparator is in positive saturation, capacitor C1 is charged by a constant current supplied by transistor 230. When the comparator is in negative saturation, transistor 220 supplies the current to discharge capacitor C1.

Figure 3:
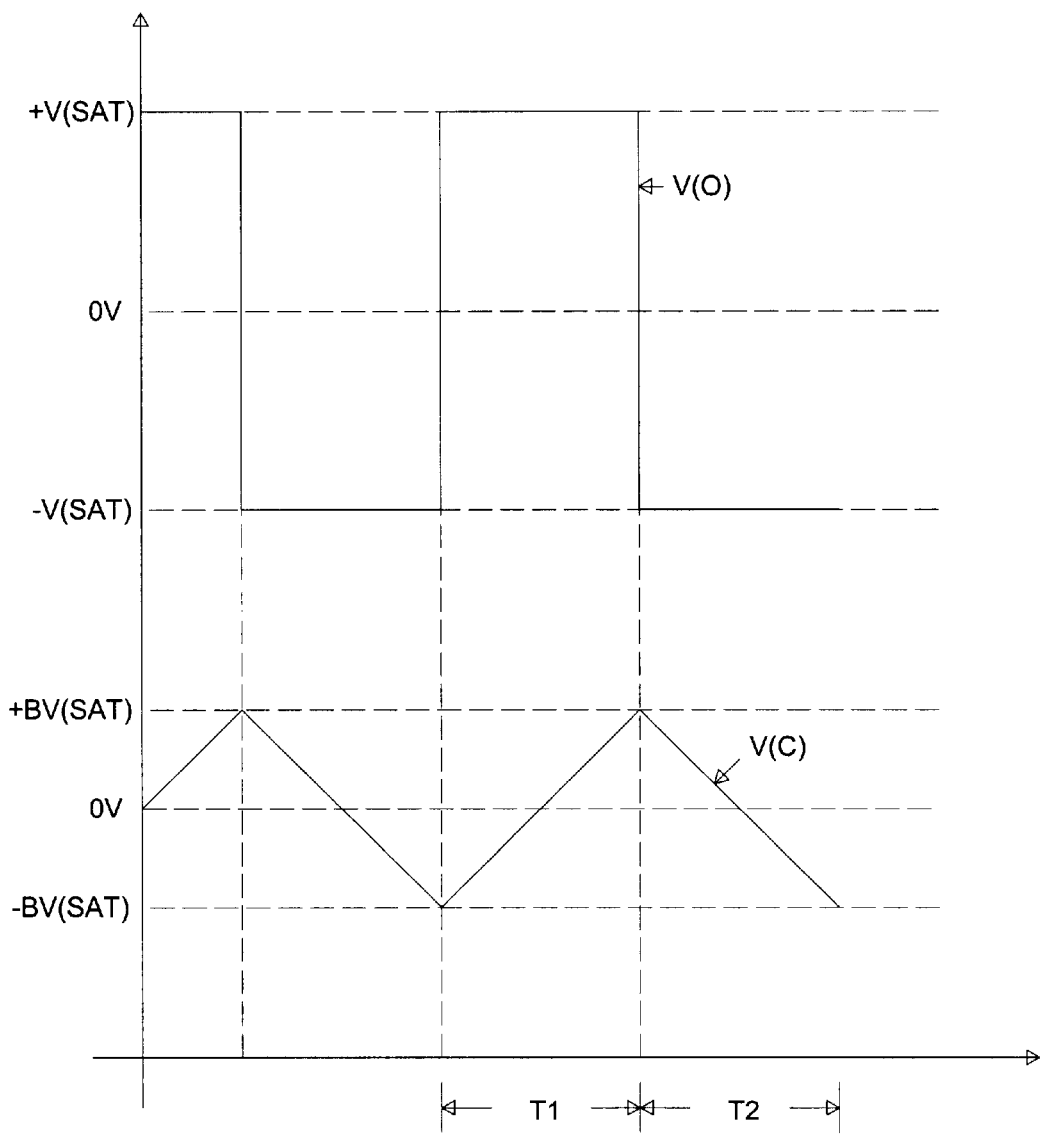
FIG. 3 shows the waveforms for the output voltage, V(O), and the capacitor C1 voltage, V(C), of an exemplary voltage controlled oscillator according to the principles of the present invention.

FIG. 3 shows the waveforms for the output voltage, V(O), and the capacitor C1 voltage, V(C). Operational amplifier 210 operates as a comparator due to positive feedback provided by resistors R1 and R2. The non-inverting input of operational amplifier 210 is labeled V+ and the inverting input of operational amplifier 210 is labeled V−. The output voltage V(O) swings between its saturation values +V(SAT) and −V(SAT). The output V(O) changes from +V(SAT) to −V(SAT) when V−>βV(SAT), where:

$$\beta = R2/(R1+R2).$$

The output changes from −V(SAT) to +V(SAT) when V−<−βV(SAT).

After the circuit reaches a steady state, assume that output voltage V(O) of the operational amplifier has just saturated at V(O)=V(SAT). Transistor 230 is in its active region if $$V(SAT)-V(IN) \geq V(\tau),$$

where V(τ) is the cut-in voltage of transistor 230. Transistor 220 is cut-off because its emitter terminal is at a higher voltage that its base terminal. As a result, $$I(2)=[V(SAT)-V(\tau)-V(IN)]/R$$

and I(1)=0. Therefore, the current through capacitor C1 is:

$$I(C)=I(1)+I(2)=I(2).$$

The voltage V(C) across capacitor C1 rises linearly and is given by $$V(C)=[I(2)/C]t-\beta V(SAT)$$

When V(C)=V−=βV(SAT) after time T1, the output V(O) changes to −V(SAT). Time T1 is computed as follows:

$$V(C)(T1)=\beta V(SAT) \ [[V(SAT)-V(\tau)-V1]/RC]T1-\beta V(SAT)=\beta V(SAT)$$

$$T1=[2\beta V(SAT)RC]/[V(SAT)-V(\tau)-V(1). \quad (1)$$

After time T1, transistor 230 is cut-off because its base-emitter junction is reverse biased. However, transistor 220 is in its active region if $$-V(SAT)+V(IN) \geq V(\tau).$$

As a result, I(2)=0 and the current through the capacitor C1 is given by $$I(C)=I(1)=[-V(SAT)+V(IN)+V(\tau)]/R.$$

The voltage across capacitor C1 falls linearly and is given by:

$$V(C)=[I(C)/C](t-T1)+\beta V(SAT); =[[-V(SAT)+V(IN)+V(\tau)]/RC](t-T1)+\beta V(SAT).$$

At time t−T1=T2, the capacitor C1 voltage V(C)=−βV(SAT), and the output switches to +V(SAT), thereby starting a new cycle of oscillation. T2 is found as follows $$V(C)(T1+T2)=-\beta V(SAT) \ [[-V(SAT)+V(IN)+V(\tau)]/RC]T2+\beta V(SAT)=-\beta V(SAT)$$

$$T2=[2\beta V(SAT)RC]/[V(SAT)-V(\tau)-V(IN)] \quad (2)$$

The frequency of oscillation, f, is defined as $$f=1/[T1+T2] \quad (3)$$

Substituting Equations 1 and 2 in Equation 3, we obtain $$f=[V(SAT)-V(\tau)-V(1)]/[4\beta V(SAT)RC] \quad (4)$$

From Equation 4 it is clear that f has a linear relationship with the input voltage V(IN). As V(IN) is increased toward V(SAT), the frequency of oscillation approaches 0 Hz.

Figure 4:
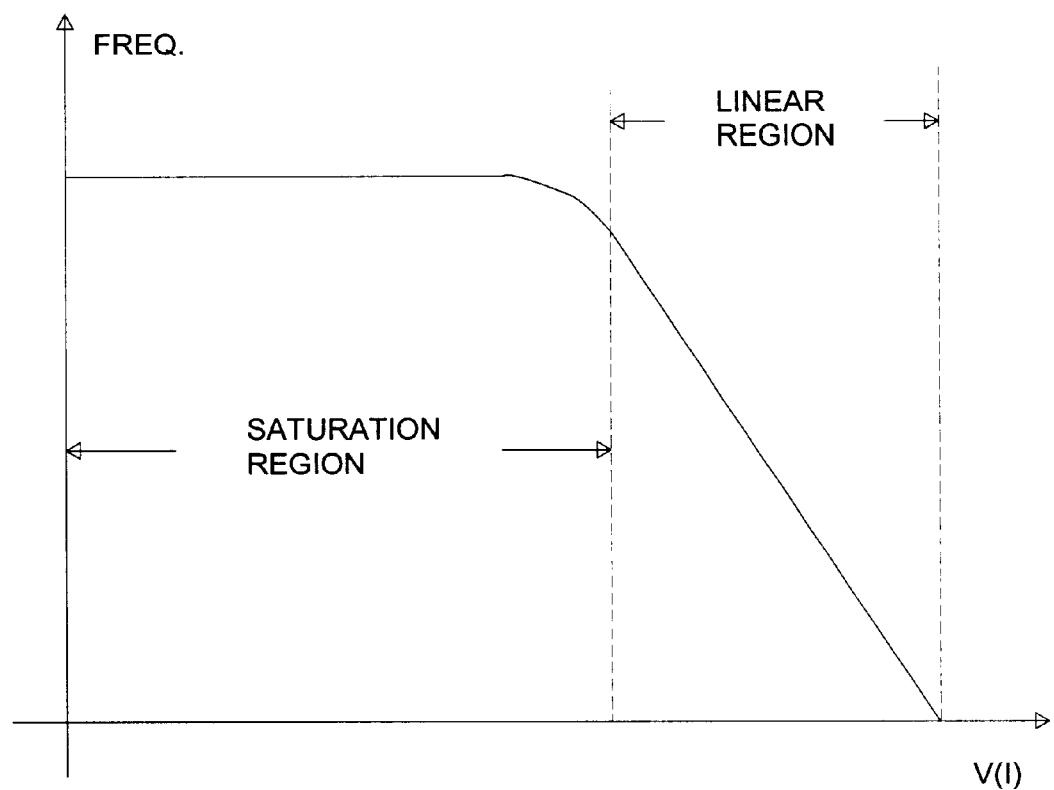
FIG. 4 illustrates the frequency-voltage plot of an exemplary voltage controlled oscillator according to the principles of the present invention.

FIG. 4 illustrates the frequency-voltage plot of exemplary voltage controlled oscillator 115. The plot consists of two regions: 1) a linear region in which the oscillation frequency depends on the control voltage; and 2) a saturation region in which the frequency is limited by parasitic effects such as the slew-rate of operational amplifier 510.

Figure 5:
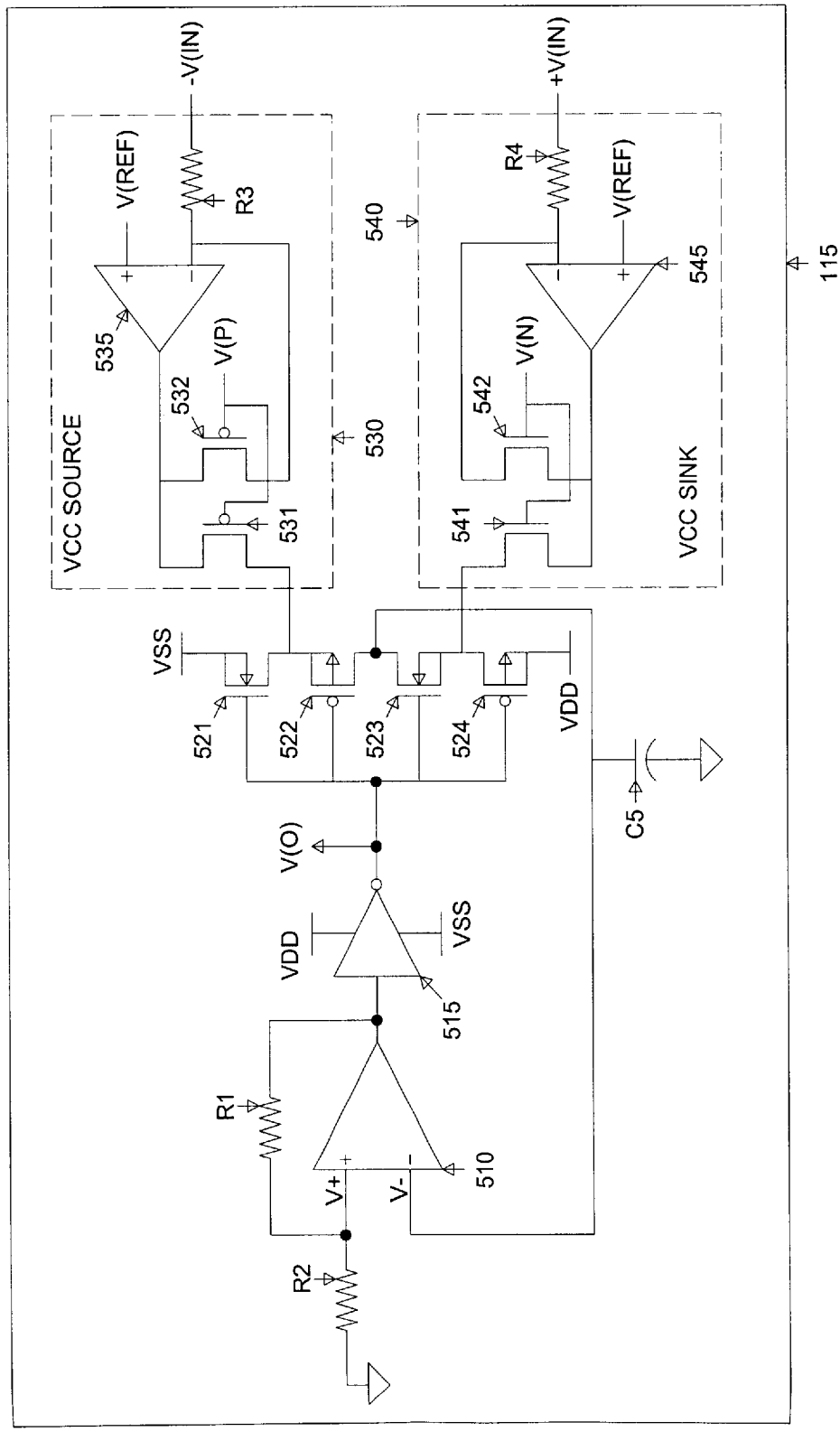
FIG. 5 illustrates the exemplary voltage controlled oscillator in greater detail according to a second embodiment of the present invention.

FIG. 5 illustrates exemplary voltage controlled oscillator 115 in greater detail according to a second embodiment of the present invention. In the embodiment shown in FIG. 5, metal-oxide-silicon field effect transistors (MOSFET) are used. In FIG. 5, voltage controlled oscillator 115 comprises operational amplifier 510, resistors R1 and R2, inverter 515, N-type transistor 521, P-type transistor 522, N-type transistor 523, P-type transistor 524, capacitor C5, voltage controlled current (VCC) source 530, and voltage controlled current (VCC) sink 540. VCC source 530 comprises P-type transistor 531, P-type transistor 532, resistor R3, and amplifier 535. VCC source 540 comprises N-type transistor 541, P-type transistor 542, resistor R4, and amplifier 545.

Transistors 522 and 523 charge and discharge capacitor C5 alternately. Operational amplifier 510 is used a comparator. The comparator UTP (Upper Trigger Point) and LTP (Lower Trigger Point) voltages are +βV(SAT) and −βV(SAT), respectively, where β=(R2)/(R1+R2). The output of inverter 515 is the inverse of the output of amplifier 510 and clips the swing from between +V(SAT) and −V(SAT) to between VDD (e.g., +5V) and VSS (e.g., −5V).

When the output of amplifier 510 drops to −V(SAT), the output of inverter 510, V(O), rises to +5 volts, and transistor 523 is switched ON and transistor 522 is switched OFF. As a result, capacitor C5 discharges into VCC sink 540. As capacitor C5 is discharged with a constant current source, its voltage drops in a linear fashion with time. When its voltage crosses the LTP of the comparator circuit formed by amplifier 510, the output of amplifier 510 swings to +V(SAT), and V(O), the output of inverter 510, drops to −5 volts, switching transistor 523 OFF and switching transistor 522 ON. Capacitor C5 is then charged with the current supplied by VCC source 530. The oscillations repeat when the capacitor C5 voltage crosses the UTP of the comparator formed by amplifier 510 and resistors R1 and R2. Transistors 521 and 524 are used to load transistors 531 and 541, respectively, when transistors 522 and 523 are switched OFF. This prevents VCC source 530 and VCC sink 540 from operating in non-linear regions.

In order to ensure that VCC source 530 and VCC sink 540 operate as a voltage controlled constant current source (or sink), it is necessary that transistors 531 and 532 be matched as closely as possible and transistors 541 and 542 be matched as closely as possible. Additionally, transistors 531, 532, 541, and 541 must all operate in their pinch-off regions. Transistors 531 and 532 form a current mirror, since both have the same gate-to-source voltages. Transistors 541 and 542 also form a current mirror, since both have the same gate-to-source voltages.

For example, for transistors 541 and 542, this condition requires that:

$$V(REF) > V(N) - V(TN) \quad (5)$$

where V(N) is the voltage at the gate terminals of transistors 541 and 542 with respect to ground, and V(TN) is the threshold voltage of transistors 541 and 542. When the transistors are pinched-off, the drain current $I_D$ through transistor 542 is given by $$I_D = [V(IN) - V(REF)]/R = k(W/L)[V(N) - V' - V(TN)]^2[1 + \lambda(V' - V(REF))]$$

where W/L denotes the aspect ratio of transistor 542, and V' denotes the output voltage of operational amplifier 545.

Equation 6 may be used to find V', which must be in the linear region of operational amplifier 545. The same drain current $I_D$ flows in transistor 541. The current in transistor 541 is the constant discharging current that discharges capacitor C5 in a linear fashion. Similarly, the constant current in transistor 532 is mirrored in transistor 531. The current in transistor 531 is the constant charging current that charges capacitor C5 in a linear fashion.

Although the present invention has been described in detail, those skilled in the art should understand that they can make various changes, substitutions and alterations herein without departing from the spirit and scope of the invention in its broadest form.

What is claimed is:

1. A voltage controlled oscillator (VCO) capable of receiving a +V(IN) control voltage and a −V(IN) control voltage and outputting a VCO output signal having a frequency of oscillation determined by said +V(IN) control voltage and said −V(IN) control voltage, said VCO comprising:
   a storage capacitor capable of being charged linearly by a constant charge current and discharged linearly by a constant discharge current;
   a comparator capable of comparing a voltage on said storage capacitor to an upper threshold voltage and a lower threshold voltage, wherein an output of said comparator drops to a negative saturation voltage (−V(SAT)) when said storage capacitor voltage rises above said upper threshold voltage and said comparator output rises to a positive saturation voltage (+V(SAT)) when said storage capacitor voltage drops below said lower threshold voltage;
   a constant charge current source capable of injecting said constant charge current to said storage capacitor when said comparator output rises to said positive saturation voltage; and
   a constant discharge current source capable of draining said constant discharge current from said storage capacitor when said comparator output drops to said negative saturation voltage.

2. The voltage controlled oscillator (VCO) as set forth in claim 1 wherein said comparator output is coupled to said VCO output.

3. The voltage controlled oscillator (VCO) as set forth in claim 2 wherein said constant charge current is determined by said +V(IN) control voltage.

4. The voltage controlled oscillator (VCO) as set forth in claim 3 wherein said constant discharge current is determined by said −V(IN) control voltage.

5. The voltage controlled oscillator (VCO) as set forth in claim 4 wherein said constant charge current source comprises a PNP-type bipolar junction transistor having a base coupled to said +V(IN) control voltage, an emitter coupled to said comparator output via a load resistor, and a collector coupled to said storage capacitor.

6. The voltage controlled oscillator (VCO) as set forth in claim 5 wherein said constant charge current source comprises a NPN-type bipolar junction transistor having a base coupled to said −V(IN) control voltage, an emitter coupled to said comparator output via said load resistor, and a collector coupled to said storage capacitor.

7. The voltage controlled oscillator (VCO) as set forth in claim 6 wherein said comparator comprises: 1) an operational amplifier having an inverting input coupled to said storage capacitor; 2) a first resistor (R1) having a first terminal coupled to ground and a second terminal coupled to a non-inverting input of said operational amplifier; and 3) a second resistor (R2) having a first terminal coupled to an output of said operational amplifier and a second terminal coupled to said non-inverting input of said operational amplifier, wherein said operational amplifier output comprises said comparator output.

8. The voltage controlled oscillator (VCO) as set forth in claim 7 wherein said upper threshold voltage is determined by the product: $[(R1)/(R1+R2)][+V(SAT)]$.

9. The voltage controlled oscillator (VCO) as set forth in claim 7 wherein said lower threshold voltage is determined by the product: $[(R1)/(R1+R2)][-V(SAT)]$.

10. The voltage controlled oscillator (VCO) as set forth in claim 6 wherein said constant charge current is determined by a difference between said positive saturation voltage and said +V(IN) control voltage and constant discharge current is determined by a difference between said negative saturation voltage and said −V(IN) control voltage.

11. A processing system comprising:
   a clocked circuit capable of operating at very low frequency using an external clock signal; and
   a phase-locked loop (PLL) coupled to said clocked circuit capable of supplying said external clock signal with high linearity at very low frequency, said PLL comprising:
      a frequency divider circuit for dividing a frequency of said external clock signal by N;
      a phase detector capable of detecting a phase difference between a frequency divided output of said frequency divider circuit and an input reference signal and generating therefrom a phase difference signal;
      a charge pump and loop filter circuit capable of converting said phase difference signal to a +V(IN) control voltage and a −V(IN) control voltage; and
      a voltage controlled oscillator (VCO) capable of receiving said +V(IN) control voltage and said −V(IN) control voltage and outputting a VCO output signal having a frequency of oscillation determined by said +V(IN) control voltage and said −V(IN) control voltage, said VCO comprising:
         a storage capacitor capable of being charged linearly by a constant charge current and discharged linearly by a constant discharge current;
         a comparator capable of comparing a voltage on said storage capacitor to an upper threshold voltage and a lower threshold voltage, wherein an output of said comparator drops to a negative saturation voltage (−V(SAT)) when said storage capacitor voltage rises above said upper threshold voltage and said comparator output rises to a positive saturation voltage (+V(SAT)) when said storage capacitor voltage drops below said lower threshold voltage;
         a constant charge current source capable of injecting said constant charge current to said storage capacitor when said comparator output rises to said positive saturation voltage; and
         a constant discharge current source capable of draining said constant discharge current from said storage capacitor when said comparator output drops to said negative saturation voltage.

12. The processing system as set forth in claim 11 wherein said comparator output is coupled to said VCO output.

13. The processing system as set forth in claim 12 wherein said constant charge current is determined by said +V(IN) control voltage.

14. The processing system as set forth in claim 13 wherein said constant discharge current is determined by said −V(IN) control voltage.

15. The processing system as set forth in claim 14 wherein said constant charge current source comprises a PNP-type bipolar junction transistor having a base coupled to said +V(IN) control voltage, an emitter coupled to said comparator output via a load resistor, and a collector coupled to said storage capacitor.

16. The processing system as set forth in claim 15 wherein said constant charge current source comprises a NPN-type bipolar junction transistor having a base coupled to said −V(IN) control voltage, an emitter coupled to said comparator output via said load resistor, and a collector coupled to said storage capacitor.

17. The processing system as set forth in claim 16 wherein said comparator comprises: 1) an operational amplifier having an inverting input coupled to said storage capacitor; 2) a first resistor (R1) having a first terminal coupled to ground and a second terminal coupled to a non-inverting input of said operational amplifier; and 3) a second resistor (R2) having a first terminal coupled to an output of said operational amplifier and a second terminal coupled to said non-inverting input of said operational amplifier, wherein said operational amplifier output comprises said comparator output.

18. The processing system as set forth in claim 17 wherein said upper threshold voltage is determined by the product: $[(R1)/(R1+R2)][+V(SAT)]$.

19. The processing system as set forth in claim 17 wherein said lower threshold voltage is determined by the product: $[(R1)/(R1+R2)][-V(SAT)]$.

20. The processing system as set forth in claim 16 wherein said constant charge current is determined by a difference between said positive saturation voltage and said +V(IN) control voltage and constant discharge current is determined by a difference between said negative saturation voltage and said −V(IN) control voltage.

21. A voltage controlled oscillator (VCO) capable of receiving a +V(IN) control voltage and a −V(IN) control voltage and outputting a V(O) output signal having a frequency of oscillation by said +V(IN) control voltage and said −V(IN) control voltage, said VCO comprising:

a storage capacitor capable of being charged linearly by a constant charge current and discharged linearly by a constant discharge current;

a comparator capable of comprising a voltage on said storage capacitor to an upper threshold voltage and a lower threshold voltage, wherein an output of said comparator drops to a negative saturation voltage (−V(SAT)) when said storage capacitor voltage rises above said upper threshold voltage and said comparator output rises to a posistive saturation voltage (+V(SAT)) when said storage capacitor voltage drops below said lower threshold voltage;

switching circuitry capable of injecting said constant charge current to said storage capacitor when said comparator output rises to said positive saturation voltage and capable of draining said constant discharge current from said storage capacitor when said comparator output drops to said negative saturation voltage;

a constant charge current source coupled to said switching circuitry and capable of generating said constant charge current, said constant charge current source comprising:

a first amplifier capable of comparing said −V(IN) control voltage to a V(REF) reference voltage and generating a first amplifier output signal;

a first P-channel transistor driven by said first amplifier output signal, wherein said first amplifier output signal generates a first controlled drain current in said first P-channel transistor; and a second P-channel transistor configured as a current mirror of said first P-channel transistor, wherein a second controlled drain current of said second P-channel transistor comprises said constant charge current; and a constant discharge current source coupled to said switching circuitry and capable of generating said constant discharge current comprising.

a second amplifier capable of comparing said +V(IN) control voltage to said V(REF) reference voltage and generating a second amplifier output signal;

a first N-channel transistor driven by said second amplifier output signal, wherein said second amplifier output signal generates a third controlled drain current in said first N-channel transistor; and a second N-channel transistor configured as a current mirror of said first N-channel transistor, wherein a fourth controlled drain current of said second N-channel transistor comprises said constant discharge current.

22. The voltage controlled oscillator (VCO) as set forth in claim 21 wherein said comparator output is coupled to said VCO output.

23. The voltage controlled oscillator (VCO) as set forth in claim 22 wherein said constant charge current is determined by said −V(IN) control voltage and said V(REF) reference voltage.

24. The voltage controlled oscillator (VCO) as set forth in claim 23 wherein said constant discharge current is determined by said +V(IN) control voltage and said V(REF) reference voltage.

* * * * *

UNITED STATES PATENT AND TRADEMARK OFFICE
CERTIFICATE OF CORRECTION

PATENT NO.    : 6,734,742 B2
DATED         : May 11, 2004
INVENTOR(S)   : Srikanth R. Muroor It is certified that error appears in the above-identified patent and that said Letters Patent is hereby corrected as shown below:

Drawings,
Figure 2, replace "R1" with -- R2 -- and "R2" with -- R1 --.
Figure 5, replace "R1" with -- R2 -- and "R2" with -- R1 --.
Figure 4, please replace "V(1)" with -- V(IN) --.

Column 4,
Lines 48-49, replace equation "V(C)(T1) = ßV(SAT)[[V(SAT)-V(t)-V1]/RC]T1 - ßV(SAT) = BV(SAT)T1 = [2ßV(SAT)R3C]/[V(SAT-V(t)-V(1)]" with the two equations -- V(C)(T1) = ßV(SAT) -- and -- [[V(SAT)-V(t)-V(IN)]/R3C1]T1 - ßV(SAT) = ßV(SAT)T1 = [2ßV(SAT)R3C]/[V(SAT)-V(t) - V(IN)] --.

Column 5,
Line 20, replace "R" within the equation with -- R3 --.
Line 29, replace equation "V(C) = [1(2)/C]t - ßV(SAT)" with -- V(C) = [I(2)/C1]t - ßV(SAT) = [[V(SAT)-V(t)-V(IN)]/R3C1]t - ßV(SAT), where t denotes time. --.
Line 44, replace equation "R" within the equation -- R3 --.
Lines 48-49, replace "I(C)/C" within the equation with -- I (C)/C1 -- and "RC" within the equation with -- R3C1 --.
Lines 54-55 and 57, replace "RC" within the equation with -- R3C1 --.
Line 63, replace "V(1)" within the equation with -- V(IN) -- and "RC" with -- R3C1 --

Column 7,
Line 65, replace "R1" with -- R2 --.

Column 8,
Line 1, replace "R2" with -- R1 --.
Lines 8 and 11, replace "(R1)/(R1+R2)" with -- (R2)/(R2+R1) --.

UNITED STATES PATENT AND TRADEMARK OFFICE
CERTIFICATE OF CORRECTION

PATENT NO. : 6,734,742 B2
DATED : May 11, 2004
INVENTOR(S) : Srikanth R. Muroor

It is certified that error appears in the above-identified patent and that said Letters Patent is hereby corrected as shown below:

<u>Column 9,</u>
Line 16, replace "R1" with -- R2 --.
Line 18, replace "R2" with -- R1 --.
Lines 26 and 29, replace "(R1)/(R1+R2)" with -- (R2)/(R2+R1) --.

Signed and Sealed this

Third Day of August, 2004

JON W. DUDAS
*Acting Director of the United States Patent and Trademark Office*